US010384299B2

United States Patent
Lancaster-Larocque et al.

(10) Patent No.: US 10,384,299 B2
(45) Date of Patent: Aug. 20, 2019

(54) ELECTRON BEAM CONDITIONING

(71) Applicant: Apple Inc., Cupertino, CA (US)

(72) Inventors: Simon R. Lancaster-Larocque, Gloucester (CA); Collin Chan, San Jose, CA (US); Kensuke Uemura, Niigata (JP); Purwadi Raharjo, Niigata (JP)

(73) Assignee: Apple Inc., Cupertino, CA (US)

(*) Notice: Subject to any disclaimer, the term of this patent is extended or adjusted under 35 U.S.C. 154(b) by 989 days.

(21) Appl. No.: 13/928,264

(22) Filed: Jun. 26, 2013

(65) Prior Publication Data

US 2015/0001192 A1    Jan. 1, 2015

(51) Int. Cl.
| | |
|---|---|
| *B23K 15/00* | (2006.01) |
| *B23K 15/02* | (2006.01) |
| *B23K 20/12* | (2006.01) |
| *H01J 37/05* | (2006.01) |
| *H01J 37/305* | (2006.01) |

(52) U.S. Cl.
CPC ............ *B23K 15/00* (2013.01); *B23K 15/02* (2013.01); *B23K 20/122* (2013.01); *H01J 37/05* (2013.01); *H01J 37/305* (2013.01); *H01J 2237/05* (2013.01)

(58) Field of Classification Search
CPC ....... G06Q 20/023; G06Q 20/34; G06Q 40/02
USPC ...... 219/50, 121.11, 121.12, 121.13, 121.14, 219/121.26
See application file for complete search history.

(56) References Cited

U.S. PATENT DOCUMENTS

| | | | |
|---|---|---|---|
| 939,528 A | 11/1909 | Meyers | |
| 2,106,768 A * | 2/1938 | Southworth | .......... H01P 1/2138 |
| | | | 136/213 |
| 2,640,806 A | 6/1953 | Hesch et al. | |
| 3,228,816 A | 1/1966 | Kendall | |

(Continued)

FOREIGN PATENT DOCUMENTS

| | | |
|---|---|---|
| CN | 1067397 A | 12/1992 |
| CN | 1318157 A | 10/2001 |

(Continued)

OTHER PUBLICATIONS

Japanese Patent Application No. 2014-089527—First office action dated Aug. 3, 2015.

(Continued)

*Primary Examiner* — Dana Ross
*Assistant Examiner* — Joseph W Iskra
(74) *Attorney, Agent, or Firm* — Dickinson Wright RLLP

(57) ABSTRACT

The described embodiments relate generally to adjusting output or conditioning of an electron beam. More specifically various configurations are disclosed that relate to maintaining a footprint of the electron beam incident to a workpiece within a defined energy level. Such a configuration allows the electron beam to heat only specific portions of the workpiece to a superheated state in which intermetallic compounds are dissolved. In one embodiment a mask is disclosed that prevents low energy portions of an electron beam from contacting the workpiece. In another embodiment the electron beam can be focused in a way that maintains the electron beam at an energy level such that substantially all of the electron beam is above a threshold energy level.

14 Claims, 10 Drawing Sheets

(56) References Cited

U.S. PATENT DOCUMENTS

| | | | |
|---|---|---|---|
| 4,231,657 A | 11/1980 | Iwamatsu | |
| 4,271,348 A * | 6/1981 | Nakazaki | B23K 15/00 219/121.13 |
| 4,425,204 A | 1/1984 | McLaughlin | |
| 4,642,445 A * | 2/1987 | Stol | B23K 26/12 219/121.84 |
| 4,956,022 A | 9/1990 | Mahmoud | |
| 5,049,448 A | 9/1991 | Ohya et al. | |
| 5,273,102 A * | 12/1993 | Lillquist | B22D 23/06 164/452 |
| 5,393,953 A | 2/1995 | Itoh et al. | |
| 5,405,493 A | 4/1995 | Goad | |
| 5,868,952 A * | 2/1999 | Hatakeyama | G03F 7/001 216/45 |
| 5,981,901 A * | 11/1999 | La Rocca | B23K 26/123 219/121.63 |
| 6,261,938 B1 | 7/2001 | Beauvais et al. | |
| 6,772,935 B2 * | 8/2004 | Scheglmann | B23K 20/1235 228/112.1 |
| 6,825,123 B2 | 11/2004 | Haerle et al. | |
| 6,827,135 B1 | 12/2004 | Kramer et al. | |
| 7,176,405 B2 * | 2/2007 | Shareef | B23K 26/703 219/121.6 |
| 7,931,859 B2 * | 4/2011 | Mlodzinski | A61J 1/20 221/123 |
| 8,252,382 B2 | 8/2012 | Chung et al. | |
| 8,294,125 B2 * | 10/2012 | Han | G01B 15/00 250/397 |
| 2001/0036746 A1 | 11/2001 | Sato et al. | |
| 2002/0168466 A1 * | 11/2002 | Tapphorn | B05B 7/144 427/180 |
| 2002/0190035 A1 | 12/2002 | Giacobbe et al. | |
| 2004/0028109 A1 | 2/2004 | Rice et al. | |
| 2004/0214139 A1 | 10/2004 | Kensuke et al. | |
| 2006/0042651 A1 | 3/2006 | Verhaverbeke et al. | |
| 2006/0049059 A1 | 3/2006 | Chao et al. | |
| 2007/0182942 A1 * | 8/2007 | Kasono | B82Y 10/00 355/53 |
| 2009/0314824 A1 | 12/2009 | Sawaguchi | |
| 2011/0020552 A1 | 1/2011 | Seid et al. | |
| 2012/0021568 A1 | 1/2012 | Mino et al. | |
| 2012/0058216 A1 | 3/2012 | Ihara | |
| 2013/0248374 A1 | 9/2013 | Lancaster-Larocque et al. | |
| 2013/0248486 A1 | 9/2013 | Lancaster-Larocque et al. | |
| 2015/0001192 A1 | 1/2015 | Lancaster-Larocque et al. | |

FOREIGN PATENT DOCUMENTS

| | | |
|---|---|---|
| CN | 1336325 | 2/2002 |
| CN | 101713777 | 5/2010 |
| CN | 103050503 | 4/2013 |
| CN | 203833984 U | 9/2014 |
| EP | 0518536 * | 12/1992 |
| EP | 1634670 B1 | 6/2010 |
| JP | 2002170511 | 6/2002 |
| JP | 2006187799 | 7/2006 |
| JP | 2006344931 | 12/2006 |
| JP | 2009018335 | 1/2009 |
| JP | 2009107011 | 5/2009 |
| JP | 2009178764 | 8/2009 |
| JP | 2010100904 | 5/2010 |
| KR | 10-2008-0105772 A | 12/2008 |
| TW | I326106 B | 6/2010 |
| WO | 2008124062 A1 | 10/2008 |
| WO | 2012122300 A2 | 9/2012 |

OTHER PUBLICATIONS

Chinese Application for Invention No. 201410223350.4—First Office Action dated Jan. 5, 2016.

Devjatkov, V.N. et al. "Installation for Treatment of Metal Surfaces by Low Energy Electron Beam", 7th International Conference on Modification of Materials with Particle Beams and Plasma Flows, Tomsk, Russia, Jul. 25-29, 2004, pp. 43-46.

Chinese Patent for Utility Model No. ZL2014202717419—Evaluation Report for Utility Model Patent dated Nov. 5, 2014.

Chinese Patent Application No. 201410223350.4—Office Action dated Aug. 30, 2016.

Panahi et al., "Influence of cooling rate and composition on formation of intermetallic phases in solidifying Al—Fe—Si melts", vol. 50, No. 2, Canadian Institute of Mining, Metallurgy and Petroleum, Published by Maney on behalf of the Institute Received Jun. 17, 2010; accepted Dec. 1, 2010, 8 pages.

Denquin, "Metallurgy and Friction Stir Welding", Onera, Chatillon, France Department of Metallic Structures and Materials, 24 pages.

* cited by examiner

A-A

ELECTRON BEAM CONDITIONING

BACKGROUND

Technical Field

The described embodiments relate generally to thermal processing using a beam of directed energy. More specifically, an electron beam is conditioned in accordance with a desired metallic state of a metal workpiece.

Related Art

Various types of machining operations can cause impurities present in a metal workpiece to form intermetallic compounds along a surface of the metal workpiece as a result of heat produced during the machining operations. Intermetallic compounds disposed along the surface of the metal workpiece can prevent mechanical polishing operations from achieving a desired surface finish. The presence of the formed intermetallic compounds along the surface of the metal workpiece can also cause streaking marks to become visible when anodization is applied to the workpiece.

Therefore, what is desired is a reliable way to remove intermetallic compounds from a surface region of a metal workpiece.

SUMMARY

This paper describes various embodiments that relate to methods and systems for conditioning an electron beam.

A system for electron beam processing a surface portion of a metal workpiece is disclosed. The system is configured to maintain the metal being processed in a pre-selected metallic phase. The system includes at least the following elements: (1) an electron beam emitter configured to emit an electron beam having a first energy distribution; and (2) a mechanism disposed between the electron beam emitter and the metal workpiece that operates on the electron beam emitted by the electron beam emitter altering the first energy distribution to a second energy distribution in accordance with the pre-selected metallic phase.

A method for conditioning an electron beam is disclosed. The described method maintains the metal workpiece in a pre-selected metallic phase during an electron beam thermal processing operation. The method includes at least the following steps: (1) emitting an electron beam having a first energy distribution; and (2) altering the first energy distribution to a second energy distribution. The second energy distribution includes a range of electron beam energies corresponding to the pre-selected metallic phase.

An electron beam processing apparatus for homogenizing a surface portion of an aluminum substrate is disclosed. The electron beam processing apparatus includes at least the following: (1) an electron beam emitter configured to emit an electron beam, the electron beam including a central portion having an energy density that changes a surface portion of the aluminum substrate from a first phase to a second phase; and (2) an electron beam conditioning element disposed between the electron beam emitter and the aluminum substrate. The electron beam-conditioning element includes a metallic substrate defining an aperture that allows only the central portion of the electron beam to contact the aluminum substrate during an electron beam processing operation, and an active cooling apparatus in thermal contact with the metallic substrate. The active cooling apparatus is configured to remove heat from the metallic substrate.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings in which.

DETAILED DESCRIPTION OF SELECTED EMBODIMENTS

Figure 1:
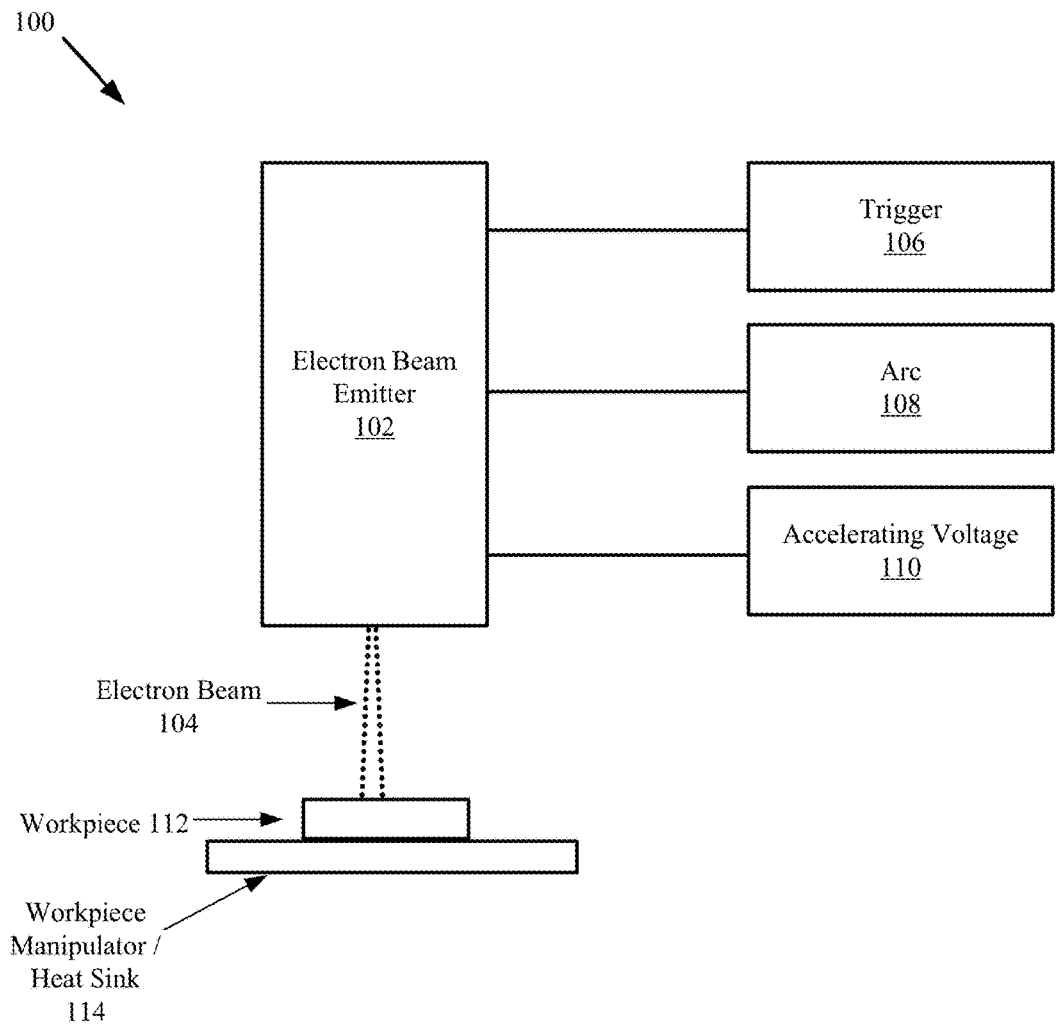
FIG. 1 shows an exemplary electron beam processor configured to irradiate a workpiece.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Method and associated apparatus for thermally conditioning a surface of metal workpiece are described. The embodiments herein described relate to a manner of thermally conditioning the metal workpiece in such a way that the underlying metal remains in a pre-determined metallic phase. In other words, a technique and apparatus suitable for electron-beam processing is described. In the context of this discussion, electron-beam (also referred to as e-beam) processing can be described as a process where electrons having a range of energy corresponding to a selected phase of a metal workpiece can be concentrated into a beam with sufficient power density to thermally condition the metal workpiece. In this way, the described electron beam processing limits exposure of the metal surface to only those electrons having an energy range corresponding to the desired metal phase. For example, preventing those electrons having a kinetic energy below a pre-determined energy level from impinging the metal surface results in the temperature of the metal surface remaining above a phase transition temperature corresponding to the pre-determined metallic phase. In one embodiment, a mechanical apparatus can be used to absorb those electrons from an electron beam having energy below the pre-determined energy level. The mechanical apparatus can take the form of, for example, a mask having an electron beam opaque portion formed of a material opaque to (i.e., absorbs) electrons incident thereon. In this way, the mask can include an electron beam transparent portion that when positioned appropriately with respect to the electron beam, only those electrons having kinetic energy above the pre-determined threshold can impinge the metal surface. In this way, the metal surface is heated to a temperature above the phase transition temperature in accordance with the desired metal phase. It should be noted that in some cases, electrons having a kinetic energy above a second threshold can also be prevented from impinging the metal surface when the second threshold corresponds to an undesired or less optimal metallic state.

An electron beam generally has an energy distribution having a peak beam current that corresponds to an accelerating voltage used to accelerate the electrons. These lower energy electrons can be problematic when e-beam processing a metal. In particular, the kinetic energy of the electrons incident on a metal surface can heat the metal surface above the melting temperature having the effect of substantially ridding a surface portion of the metal of intermetallic compounds. Unfortunately, the portion of the metal exposed to the lower energy electrons (such as those in the peripheral portions of the electron beam) do not possess sufficient kinetic energy to melt those portions of the metal surface on which they impinge. Heating the surface in such a manner actually causes intermetallic compounds to form or grow as opposed to ridding the surface of them as is intended. One solution to this problem is to mask out the peripheral portions of the electron beam, thereby allowing only a portion of the beam to contact the metal that has a great enough energy to melt the portion of the metal with which it comes into contact.

In one implementation a tungsten or stainless steel mask can be placed between an electron beam emitter and the surface portion of the metal. The mask can be actively cooled to prevent overheating of the masking material. In general the masking material should have a higher melting point than the material to which the electron beam is being applied. In another implementation, a magnetic lens can be utilized to focus the electron beam in a manner that provides a beam with lower energy variation. In some cases, this beam focusing can allow the electron beam to be utilized without a mask.

These and other embodiments are discussed below with reference to FIGS. 1-8B; however, those skilled in the art will readily appreciate that the detailed description given herein with respect to these figures is for explanatory purposes only and should not be construed as limiting.

FIG. 1 shows a block diagram of an exemplary electron beam processor 100. Electron beam processor 100 includes a plasma cathode through which an electron beam is emitted. One specific electron beam embodiment than can be used with the present embodiments is well described in papers [V. N. Devjatkov et al, Installation for Treatment of Metal Surface by Low Energy Electron Beam, 7th International Conference on Modification of Materials with Particle Beams and Plasma Flows, Tomsk Russia, 25-29 Jul. 2004 p 43-48], which is incorporated by reference in its entirety. It should be noted that the process described in the incorporated papers relates to titanium and steel electron beam polishing while the present embodiments relates generally to the removal of intermetallic compounds from aluminum substrates. Aluminum electron beam processing requires the electron beam emitter to use substantially different parameters and beam widths than those used with steel and titanium. For example an electron beam associated with convention electron beam processing of titanium or steel generally has a much smaller effective electron beam diameter than the electron beam adapted for aluminum which can have an effective diameter of about 20-30 mm. In FIG. 1 a block diagram showing components associated with electron beam processor 100 is illustrated. Electron beam emitter 102 can emit electron beam 104, which generally has a Gaussian distribution where just outside a 20-30 mm diameter a power level associated with electron beam 104 drops to about 60% of maximum power. At a diameter of about 46 mm effectiveness drops off completely. Furthermore, the electron beam can effectively polish an aluminum surface up to about 30 degrees off axis, at which point effectiveness of the beam drops off rapidly. It should be noted that in some applications a diameter of the electron beam can be reduced to about 10 mm. Electron beam emitter 102 is electrically coupled to trigger 106, arc 108 and accelerating voltage source 110. Emitted electron beam 104 can come in contact with a surface of workpiece 112. Workpiece manipulator/Heat Sink 114 can maneuver workpiece 112 in relation to electron beam 104 to keep electron beam 104 scanning steadily across a surface of workpiece 112. The following parameters were found to produce acceptable results with electron beam processor 100 when applied to aluminum: an accelerating voltage of between 5 and 25 keV; a beam current of between 20 and 300 A; an electron beam pulse duration between about 50 and 200 μs with an accompanying pulse repetition rate of between 0.3-20 Hz.

Figure 2A:
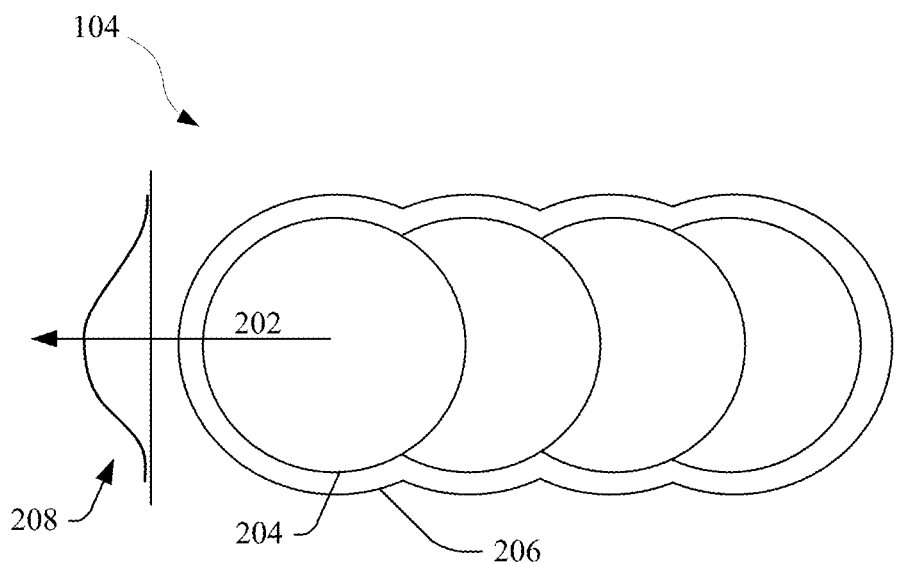
FIG. 2A shows a footprint of an electron beam moving along a linear path.

FIG. 2A shows electron beam 104 traversing a linear path in a direction and speed represented by arrow 202. The speed of the electron beam can be about 30 mm/sec. Electron beam 104 includes a high-energy region 204 and a low energy peripheral region 206. Distribution of energy within electron beam 104 is represented by curve 208. Distribution of energy within electron beam 104 is Gaussian in nature, and trails off, as depicted, towards a peripheral portion of the beam. When electron beam 104 is applied to a metal substrate, low energy peripheral region 206 can represent a portion of electron beam 104 that does not contain sufficient energy to melt a surface of the metal substrate. Although individual spot beams are depicted in discrete locations, it should be understood that electron beam 104 can be configured to move along a surface of a metal substrate at a constant speed rather than being periodically moved between positions.

Figure 2B:
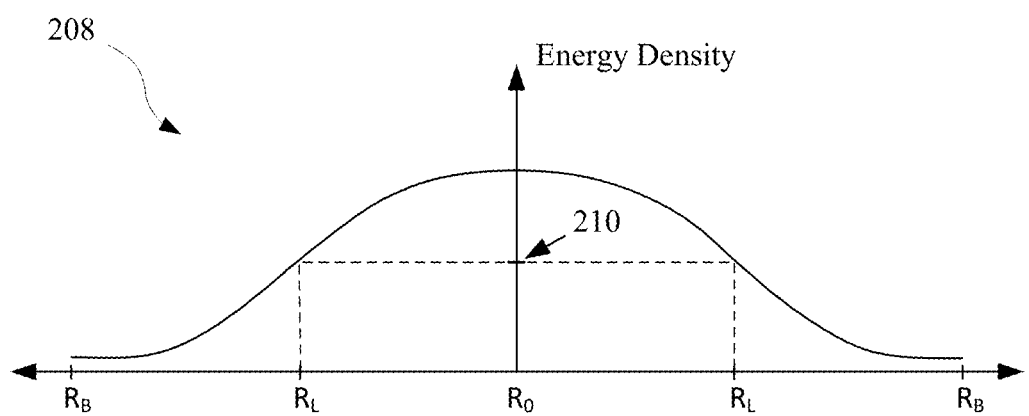
FIG. 2B shows a graph detailing an energy distribution of an electron beam.

FIG. 2B shows a more detailed view of energy density distribution curve 208. Generally speaking, the energy density of an electron beam is greatest at beam center and trails off towards the peripheral regions of the electron beam. More specifically, as shown in FIG. 2B, electron beam energy density is function of electron beam geometry in that a maximum density $E_{max}$ occurs at beam center $R_0$ energy and trails off towards the peripheral region of the electron beam. Moreover, threshold 210 defines a minimum energy required for electron beam 104 to superheat a surface of a particular metal substrate. $R_L$ represents a maximum radius of the laser that can be utilized to cause a desired phase change of the metal substrate. A portion of the beam corresponding to the area lying between $R_L$ and $R_B$ can infuse the metal substrate with additional heat, causing a formation of intermetallic compounds within the workpiece. It should be noted that while additional energy can be added to electron beam 104 that can conceivably increase the portion of curve 208 that is above energy threshold 210, such an increase in energy can cause problems with energy dissipation and in some cases deformation of the metal substrate can occur if the metal substrate is softened too much due to heat penetrating deeply into the surface. For these reason, an energy density distribution curve 208 has both an upper and lower limit. In one embodiment an upper limit for energy density of electron beam 104 can be about 10 J/cm². A phase diagram represented in FIG. 2C provides further insight into limits on energy output of electron beam 104.

Figure 2C:
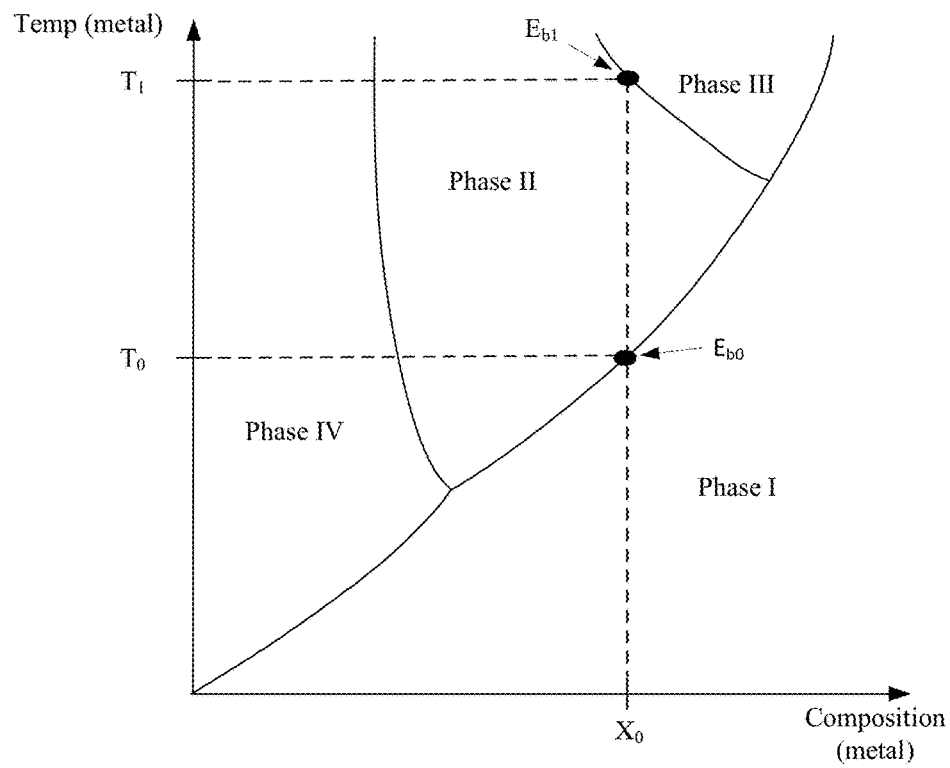
FIG. 2C shows a phase diagram graph for a metal having a preselected metallic phase within a given temperature range.

FIG. 2C shows a generic phase diagram illustrating four distinct phases of a metallic material. The vertical axis represents temperature of the metallic material and the horizontal axis represents composition of the metallic material. An electron beam can be used to deliver sufficient energy to at least a portion of the material to raise the temperature of that portion to a phase transition temperature the material changes from one phase to another. For example, when the metallic material has a composition corresponding to $X_0$ and is in Phase I electron beam irradiation can cause the material to change to Phase II when the material exceeds a temperature $T_0$. In the context of the described embodiments the phase change from Phase I to Phase II can represent the metallic material becoming superheated. The superheated state allows impurities such as intermetallic compounds within the electron beam processed portion of the material to be dissolved; however, as depicted in the diagram, if the superheated phase state is represented by Phase II, the material must be maintained at a temperature between $T_1$ and $T_2$ for the metallic material to be maintained in that particular metallic phase. The temperatures generally correspond to a particular energy distribution of the electron beam and a scanning speed of the electron beam. Faster scanning speeds of the electron beam can be more efficient for finishing more parts at faster speeds. Faster scanning speeds generally correspond to a higher energy output electron beam, so the scanning speed and energy density of the electron beam are balanced to correspond to a temperature range of the surface of the material being electron beam processed that corresponds to a desired metallic phase of the metallic material. It should be noted that while the composition $X_0$ has an upper limit corresponding to $T_1$ where Phase III is reached, different compositions can have much larger ranges within which a singular phase can be maintained. For example, in the depicted phase diagram when a composition is shifted slightly to the left of $X_0$ a much higher upper temperature bound can be achieved; however, in many cases desired metallurgical properties associated with a specific composition may not allow such a shift.

Figure 2D:
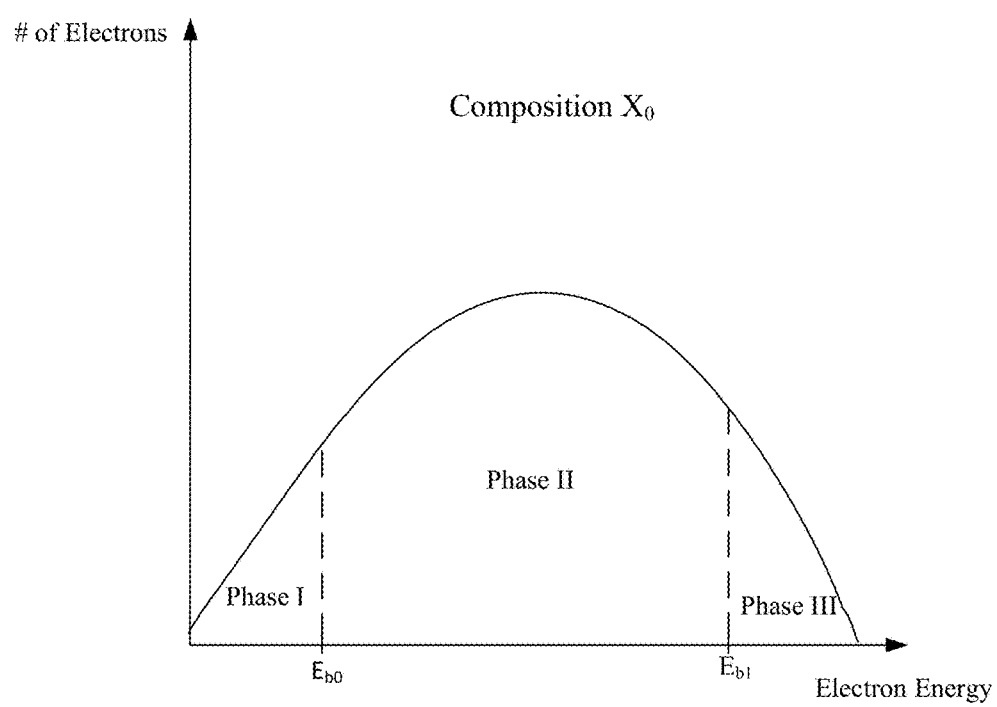
FIG. 2D shows an energy distribution for electrons in an electron beam.

FIG. 2D represents electron energies of energized electrons within an electron beam. In this exemplary figure the energy distribution of the electrons corresponds to composition $X_0$ as shown in FIG. 2C. Electrons on the left side of the graph don't have enough energy to drive the metallic material from the Gamma state into the Beta state, while electrons in the middle can drive the metallic material to a temperature between $T_0$ and $T_1$. Electrons on the right side of the graph can drive the metallic material through the Beta state and into the Delta state, thereby pushing the metallic material out of the desired state for a given application. By reducing the overall energy of the electron beam the graph can be biased such that the beam includes only two of the three states. For example, by reducing the electron beam energy only electrons with energy sufficient to reach the Beta phase can be present in the beam. Since, the lower energy electrons are generally found along a peripheral portion of the beam, masking out the peripheral portion can produce a narrower beam that puts all portions of the metallic material it comes into contact with into the Beta phase. In some electron beam configurations peripheral portions and central portions of the electron beam can be masked out to yield a Beta phase change. As an alternative to changing energy levels of the electron beam the speed at which the electron beam traverses the metallic material can also shift the values associated with $E_{b0}$ and $E_{b1}$.

Figure 3A:
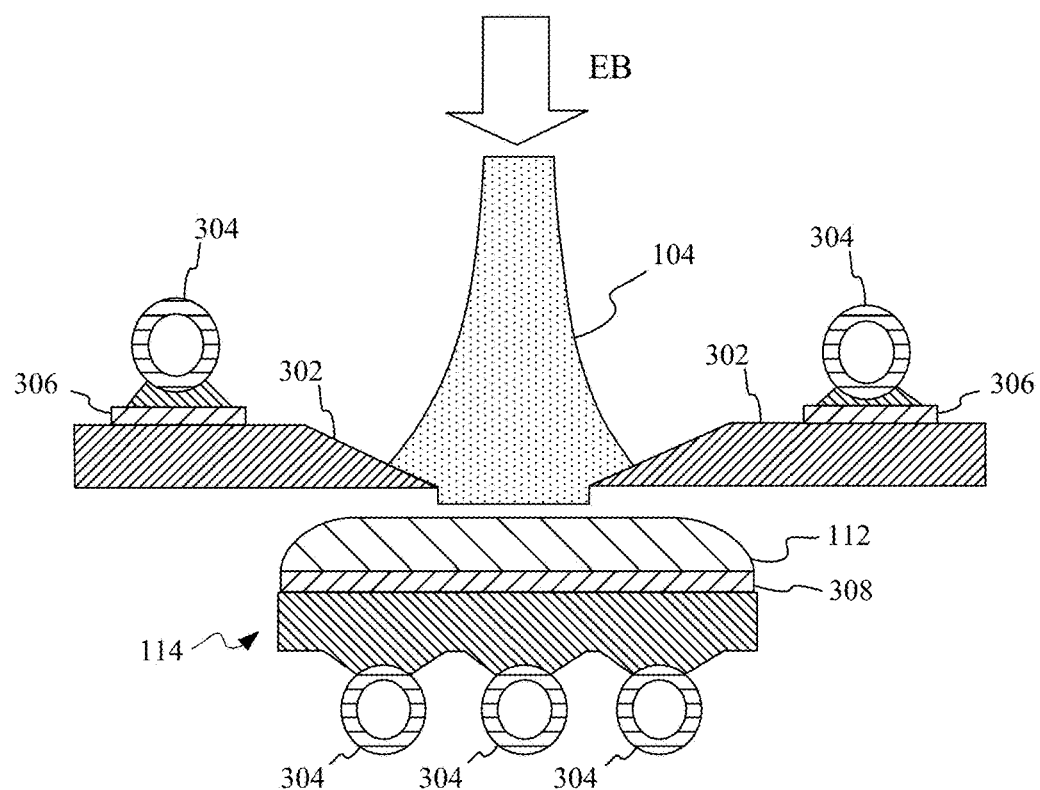
FIG. 3A shows a mask configured to prevent lower energy peripheral portions of an electron beam from hitting a workpiece.

FIG. 3A shows an apparatus for masking out portions of an electron beam that fall below a certain energy level. Electron beam 104 can be emitted from an electron beam emitter similar to electron beam emitter 102 depicted in FIG. 1. As electron beam 104 travels towards workpiece 112 it can suffer some dispersion, as depicted. Consequently, it can be beneficial to position mask 302 in close proximity to workpiece 112, thereby allowing a size of electron beam 104 coming into contact with workpiece 112 to be precisely controlled by the opening in mask 302. Because mask 302 undergoes heating as a result of peripheral portions of electron beam 104 coming into contact with it, material properties of the mask and sufficient cooling can be important to prevent mask 302 from melting or undergoing deformation during operation of the electron beam emitter. Mask 302 should generally be constructed of material having a higher melting point than workpiece 112. For example, when workpiece 112 is made from an aluminum alloy such as AISA A6063, mask 302 can be made from tungsten or stainless steel. Active cooling can help to prevent heat from building up within mask 302. Active cooling can be configured by placing heat removal components in thermal contact with mask 302. In one implementation, each of a number of cooling pipes 304 can be thermally coupled to mask 302 by way of a heat sink 306. Each of cooling pipes 304 can be thermally coupled to a heat sink 306 by way of thermally conductive paste, thereby allowing efficient conductive heat transfer between cooling pipes 304 and heat sinks 306. Active cooling can also be applied to workpiece 112. By placing workpiece 112 in direct thermal contact with workpiece heat sink 308 energy imparted to workpiece 112 by electron beam 104 can be efficiently dissipated with various forms of active cooling. As depicted, a number of cooling pipes 304 are in thermal contact with workpiece heat sink 308, allowing efficient heat dissipation from workpiece 112. It should be noted that various other forms of heat dissipation can be used, or in some cases, where electron beam irradiation is only periodic, no active cooling need be utilized. It should also be noted that mask 302 can take on many sizes, shapes and configurations. In some embodiments mask 302 defines a fixed circular opening having a size and shape in accordance with a diameter of electron beam 104. In other embodiments, mask 302 can be an adaptable iris configured to provide an aperture that can be altered during operation of the electron beam. In this way, the electron beam can be sized for a portion of workpiece 112 that it is currently being targeted on. Such a configuration can also be useful for adapting electron beam 104 for workpieces having various material compositions. In yet another embodiment, mask 302 can form a channel along which the electron beam can be traversed, as is depicted in FIG. 3B.

Figure 3B:
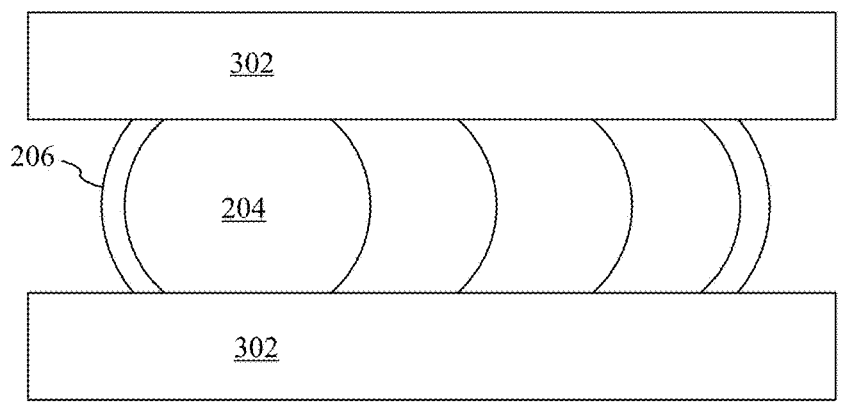
FIG. 3B shows a top view of how the mask from FIG. 3A blocks peripheral, low energy portions of an electron beam as the electron beam traverses across a workpiece.

FIG. 3B shows a top view of the masked electron beam emitter. By arranging mask 302 on either side of electron beam 104, peripheral portions of the electron beam no longer fall on workpiece 112. Instead the energy associated with low energy peripheral region 206 of electron beam 104 are absorbed by mask 302 and dissipated by cooling pipes 304. In this way, heating of portions of workpiece 112 adjacent to high energy region 204 can be minimized, thereby substantially reducing the production of intermetallic compounds along a surface portion of workpiece 112.

Figure 4A:
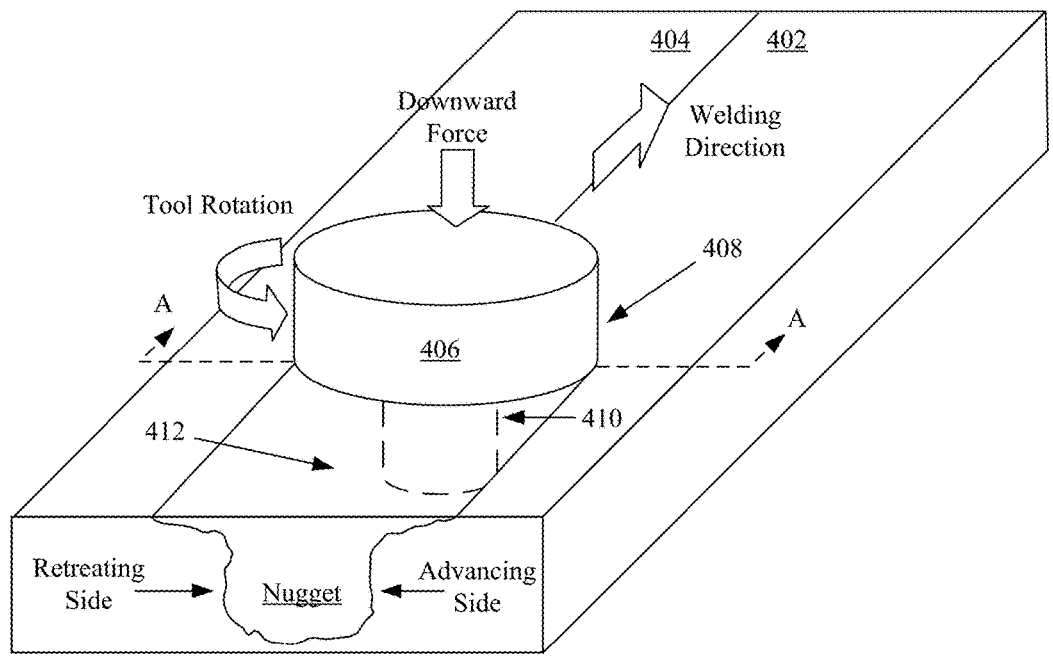
FIG. 4A shows a perspective view of an exemplary friction stir welding operation.
Figure 4B:
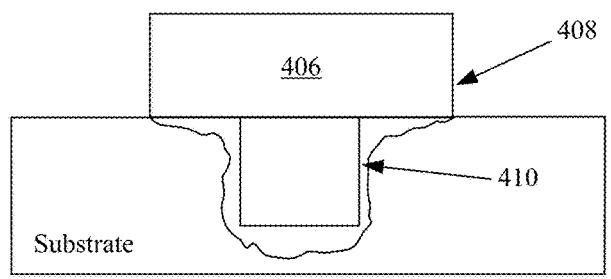
FIG. 4B shows a cross-sectional side view of the exemplary friction stir welding operation of FIG. 4A.

In one specific embodiment a masked electron beam can be used to treat a surface of a metal substrate that has undergone a friction stir welding (FSW) operation. FIG. 4A shows a perspective view of a representative FSW operation. FSW is used to join two pieces of metal 402 and 404 together. The surfaces of the metal to be joined are clamped together. A FSW operation involves a FSW tool 406. FSW tool 406 is a rotational tool that typically includes at least shoulder region 408 and pin 410. In some embodiments pin 410 can be about 3 mm in diameter. By rotating FSW tool 406 rapidly, in the direction indicated by the tool rotation arrow, pin 410 can create friction which imparts heat to the weld region sufficient to stirs up the metal on both sides of the interface between metal piece 402 and metal piece 404. In this way a friction stir welded region 412 is formed that joins the metal pieces 402 and 404 together. FIG. 4B shows a cross-sectional side view A-A of the exemplary FSW operation of FIG. 4A. Shoulder region 408 of FSW tool 406 comes into contact with at least a top surface of the metal substrates during the FSW operation. Pin 410 creates friction stir welded region 412 that extends around pin 410 as a result of the heat introduced to the metal substrates during the FSW operation.

Figure 5A:
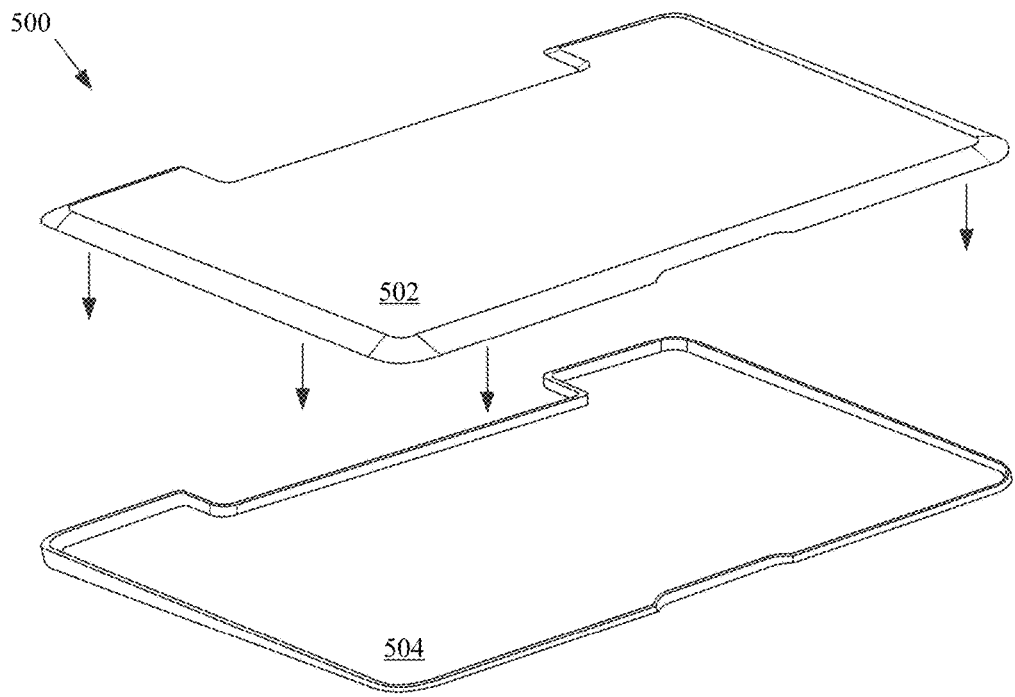
FIGS. 5A-5C show an exemplary portable computing device housing undergoing a friction stir welding operation.
Figure 5B:
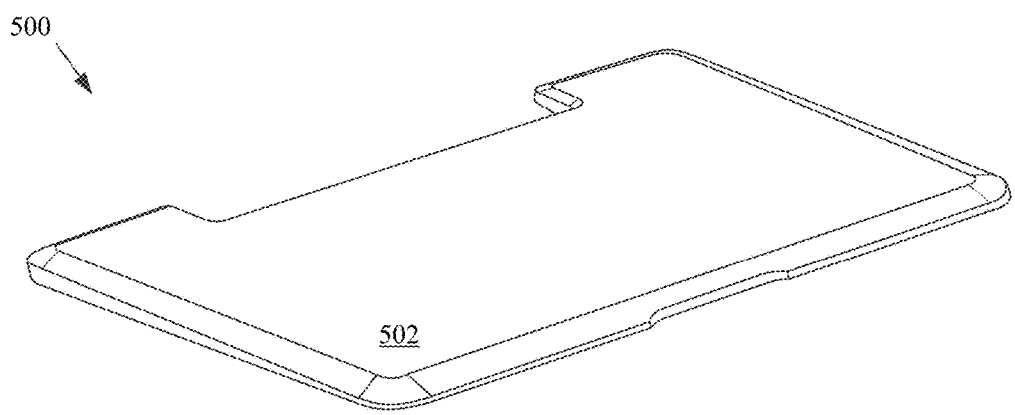
Figure 5C:
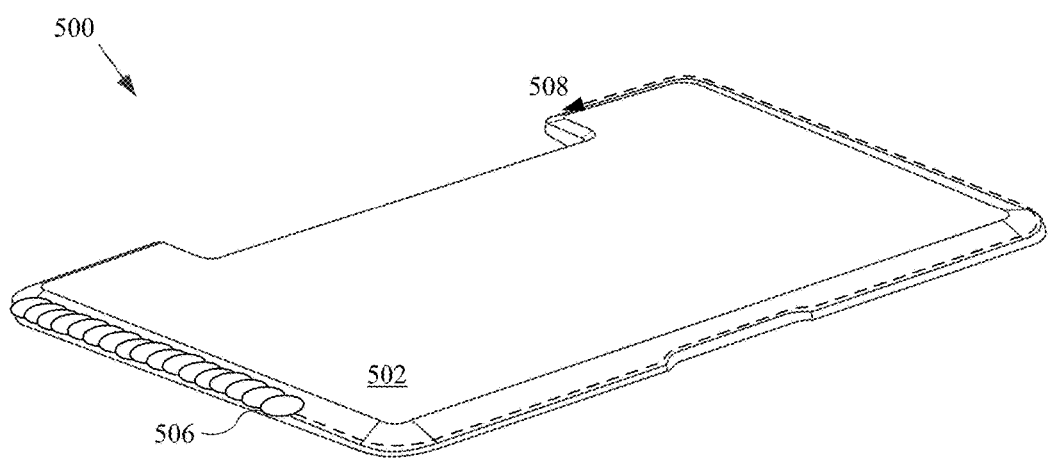

FIG. 5A shows an exemplary portable computing device housing 500 that can be formed by a FSW operation. Computing device housing 500 can be constructed from two separate housing components 502 and 504. By machining the housing components separately, features can be carved into each of the components prior to the piece being joined together in a FSW operation. Once the two housing components are formed, the two pieces can be brought together as is shown in FIG. 5B. In FIG. 5B, a compression force can be applied to each of housing components 502 and 504 prior to a FSW operation being initiated. The FSW operation can securely join housing component 502 and 504 together. Unfortunately, the heat involved in the FSW operation can cause intermetallic compounds in the friction stir welding region to grow, thereby creating substantial cosmetic differences between the friction stir welded region and other portions of housing 500 when traditional finishing methods are used. Such differences can make the finished part cosmetically unacceptable. For example, intermetallic compounds present along the surface can cause portions of the surface to flake off (the flakes are commonly referred to as orange peels) during a mechanical polishing operation. In many cases the flaking caused by the intermetallic compounds prevents creation of a miller surface across the substrate by mechanical polishing means. FIG. 5C shows how an electron beam can be used to superheat the friction stir welded region. Beam footprint 506 shows a position of the electron beam as it traverses a path 508 about housing 500 that corresponds to a location of the friction stir welded region. The electron beam removes the enlarged intermetallic compounds from the surface of the weld region, allowing subsequent finishing operations to create a consistent finish across the transition between housing components 502 and 504 and the friction stir welded region.

Figure 6:
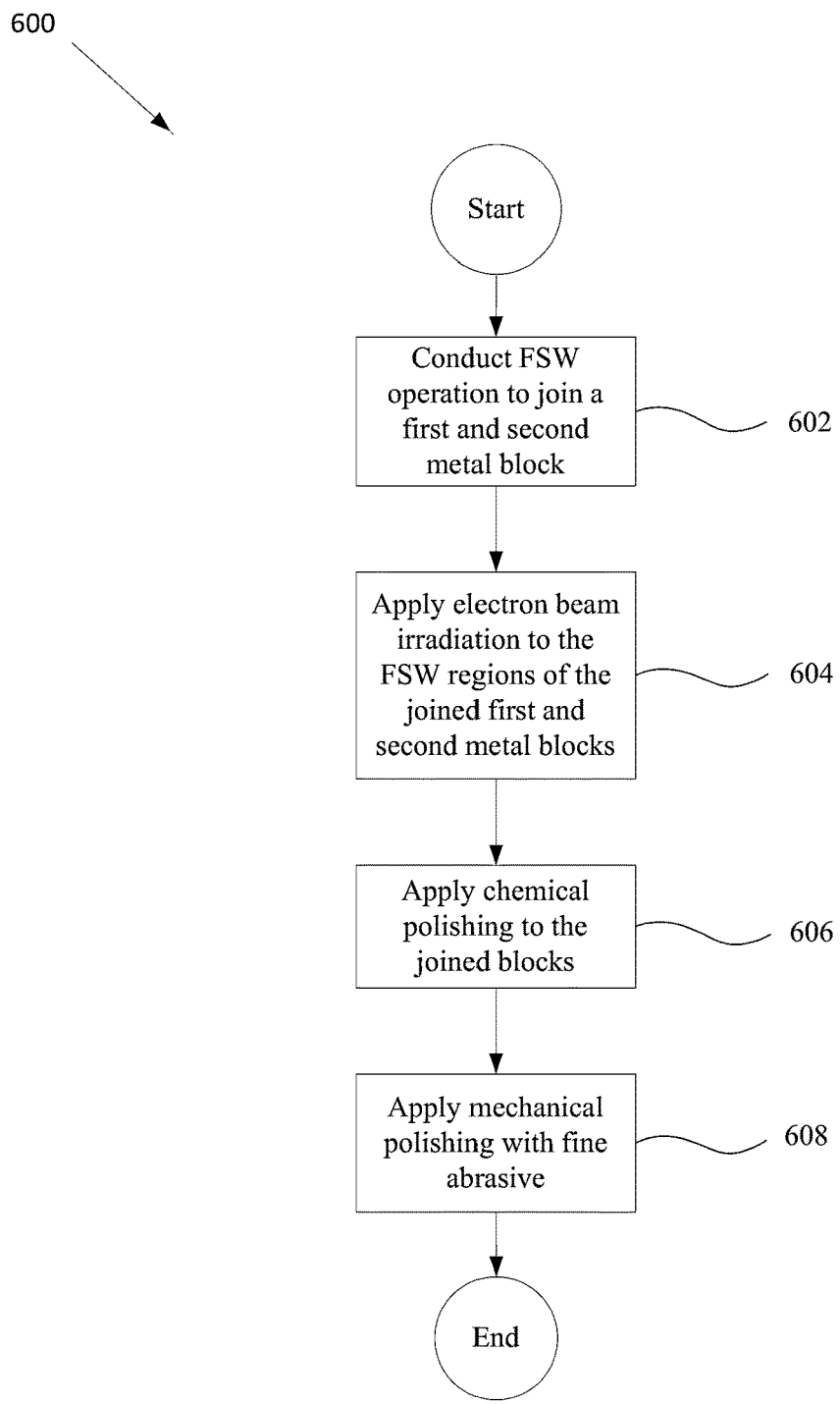
FIG. 6 shows a block diagram representing a specific finishing method adapted to apply electron beam irradiation to a friction stir welded aluminum substrate.

FIG. 6 shows a block diagram representing a specific finishing method 600 adapted to apply electron beam irradiation to a friction stir welded aluminum substrate. In a first step 602 a first aluminum block and a second aluminum block are joined together by a friction stir welding (FSW) operation. The friction stir welding operation tends to increase the size of intermetallic compounds within the aluminum substrates. In step 604, electron beam irradiation is applied to the FSW regions of the joined first and second aluminum blocks. The electron beam associated with the electron beam irradiation can be masked so that the entire portion of the beam incident to the aluminum substrate has enough energy to melt the aluminum with which it comes into contact. This prevents peripheral portions of the beam without enough energy to melt the aluminum surface from causing heating that forms more intermetallic compounds within the aluminum surface. After step 604, intermetallic compounds can be substantially dissolved about 20 and 30 microns into the surface of the aluminum substrates. At step 606 a chemical polishing operation is applied to the FSW region of the metal. The chemical polishing operation described in U.S. patent application Ser. No. 13/826,681 can be used to smooth the surface of the joined first and second blocks. At step 608 a mechanical polishing operation can be conducted to achieve a desired surface finish. This method can create a consistent surface across which anodization can be applied, leaving a consistent and pleasing surface finish. This can be accomplished with a fine abrasive. In one particular embodiment a diamond paste abrasive can be utilized. Such a finishing step removes no more than about 5 microns from a surface of the aluminum substrate.

Figure 7A:
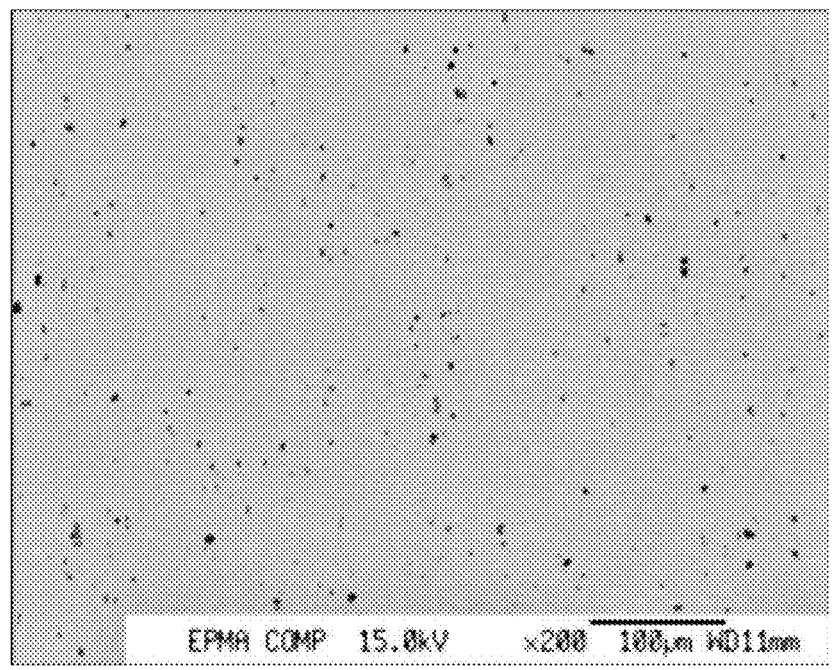
FIG. 7A shows a top view of an aluminum substrate prior to an electron beam irradiation operation.
Figure 7B:
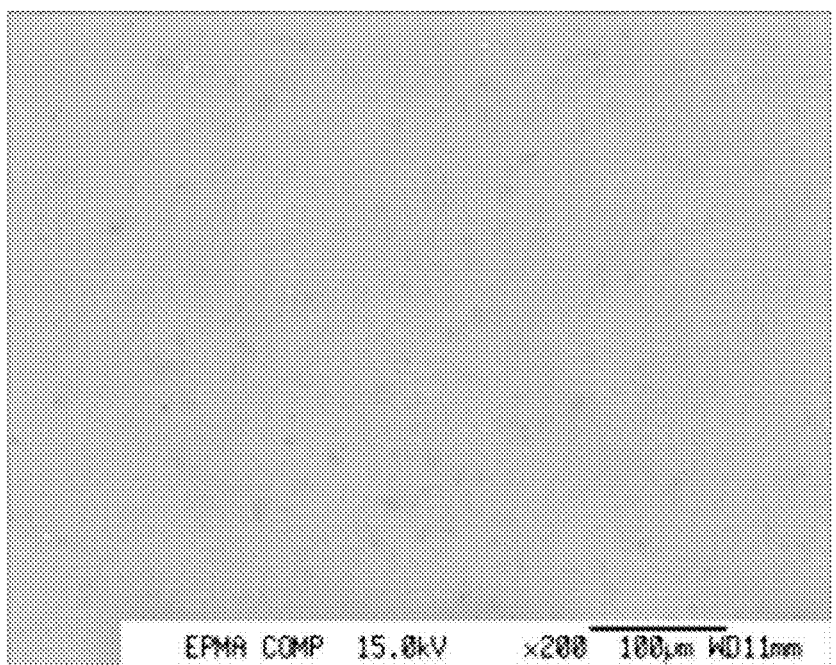
FIG. 7B shows a top view of the aluminum substrate depicted in FIG. 7A after an electron beam irradiation operation.

FIGS. 7A and 7B show a before and after look with a field emission scanning electron microscope of an aluminum substrate before and after electron beam irradiation. In FIG. 7A a number of black particles are present along the surface of the aluminum substrate. The black particles represent intermetallic compounds. After the electron beam irradiation is applied substantially all of the intermetallic compounds have been dissolved from the surface of the aluminum substrate, thereby providing a substantially homogenized area along the surface of the aluminum substrate. This prevents the intermetallic compounds from interfering with subsequent finishing operations across a surface portion of the aluminum substrate. It should be noted that the electron beam irradiation as configured is generally effective at dissolving intermetallic compounds down to a depth of about 30 microns.

Figure 8A:
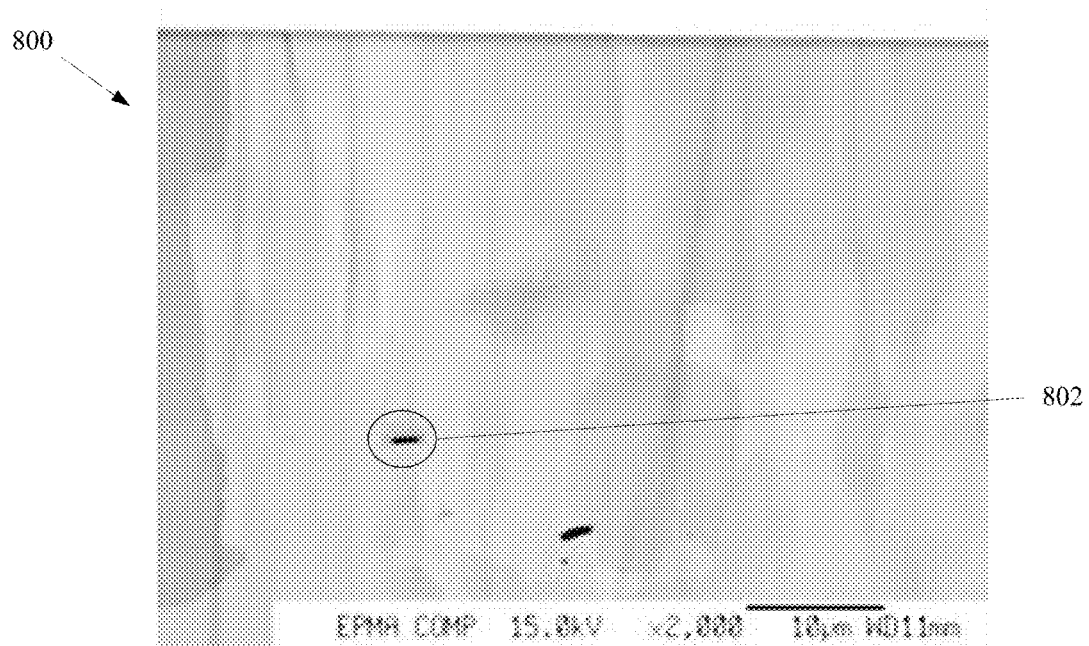
FIG. 8A shows a cross-sectional side view provided by a field emission scanning electron microscope of an aluminum substrate after an electron beam irradiation operation.
Figure 8B:
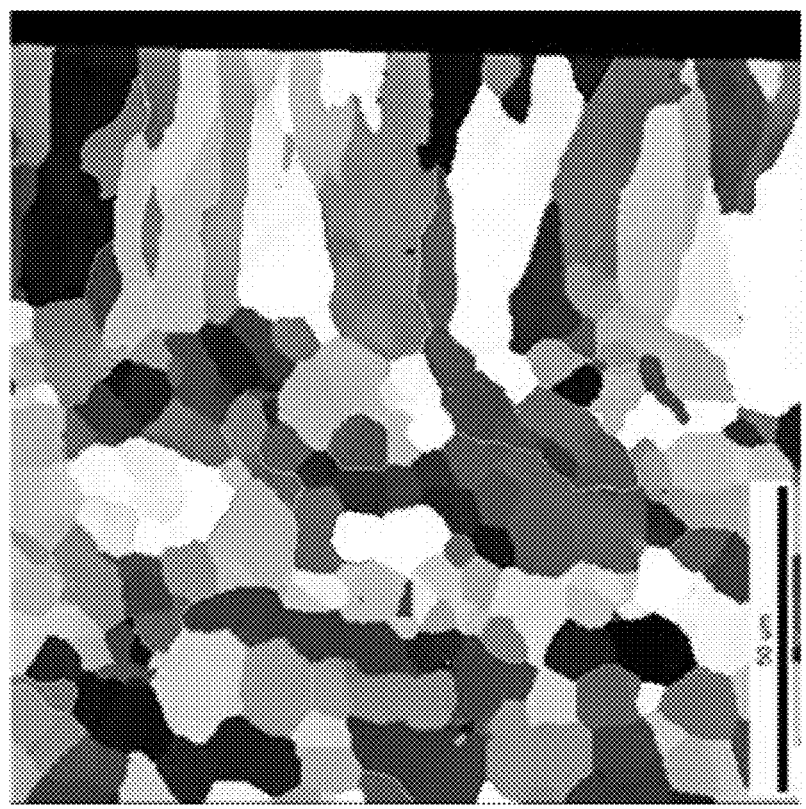
FIG. 8B shows an Electron Backscatter Diffraction cross-sectional side view of the aluminum substrate from FIG. 8A that shows the grain structure of the aluminum substrate after an electron beam irradiation operation.

FIG. 8A shows a cross-sectional side view taken by a field emission scanning electron microscope of an aluminum substrate 800 that has undergone electron beam irradiation. As a result there are no intermetallic compounds near the surface. The first intermetallic compound 802 is positioned about 30 microns into the surface of aluminum substrate 800 This allows an amount of the surface layer to be removed during a mechanical polishing operation without encountering intermetallic compounds. Furthermore, subsequent anodization treatments are typically infused about 20-30 microns into the surface of the aluminum substrate. As a result the electron beam irradiation also prevents interference between the intermetallic compounds and layers of anodization. FIG. 8B shows an Electron Backscatter Diffraction cross-sectional side view of aluminum substrate 800. In this view a grain structure of aluminum substrate 800 is shown. This shows how electron beam irradiation makes the grain structure of aluminum substrate 800 larger along the surface of the aluminum substrate.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A system for using electron beam processing to remove intermetallic compounds from a surface portion of a metal work piece, the system comprising:
   an electron beam emitter configured to emit a beam of electrons, the beam of electrons including:
      (i) a first portion corresponding to electrons characterized as having a maximum electron energy that is less than a threshold energy capable of removing the intermetallic compounds from the surface portion of the metal work piece, and
      (ii) a second portion corresponding to electrons characterized as having a minimum electron energy greater than or equal to the threshold energy; and
   an electron beam mask disposed between the electron beam emitter and the surface portion of the metal work piece, wherein when the beam of electrons is incident at the electron beam mask, the electron beam mask includes:
      (i) an electron absorbing portion that is formed of an electron absorbing material and has a size and shape capable of absorbing most of the first portion of the beam of electrons, and
      (ii) an aperture having an adjustable size and an adjustable shape that concurrently allows most of the second portion of the beam of electrons to pass through the aperture to the surface portion of the metal work piece.

2. The system as recited in claim 1, wherein the electron absorbing portion is a shutter apparatus.

3. The system as recited in claim 2, wherein the maximum electron energy that is less than the threshold energy is inconsistent with a pre-selected metallic phase of the metal work piece.

4. The system as recited in claim 1, further comprising:
   an active cooling apparatus for cooling the electron beam mask while the electron absorbing portion absorbs most of the first portion of the beam of electrons.

5. The system as recited in claim 1, wherein the threshold energy corresponds to an amount of energy required to superheat the surface portion.

6. The system as recited in claim 1, wherein an upper limit of an energy density of the electron beam is about 10 J/cm$^2$.

7. The system as recited in claim 4, wherein the electron beam mask is capable of actively removing energy at the electron beam mask that was absorbed from the beam of electrons.

8. The system as recited in claim 7, wherein the metal work piece is coupled to an actively cooled work piece manipulator during the electron beam processing.

9. A method for removing intermetallic impurities at a surface portion of a metal work piece, the method comprising:
   emitting a beam of electrons from an electron beam emitter, the beam of electrons having:
      (i) a first spatial distribution of electrons having a first range of electron energy values that are less than a selected electron energy value suitable for removing the intermetallic impurities from the surface portion of the metal work piece, and
      (ii) a second spatial distribution of electrons that is spatially independent of the first spatial distribution, wherein the second spatial distribution has a second range of electron energy values that are greater than or equal to the selected electron energy value; and
   preventing most of the electrons corresponding to the first spatial distribution from reaching the surface portion of the metal work piece while concurrently allowing most of the electrons corresponding to the second spatial distribution to reach the surface portion of the metal work piece by using an electron shield having an adjustable aperture that corresponds to the second spatial distribution.

10. The method as recited in claim 9, wherein the second range of electron energy values is suitable for superheating the surface portion.

11. The method as recited in claim 10, wherein the adjustable aperture allows most of the electrons corresponding to the second spatial distribution to reach the surface portion.

12. The method as recited in claim 11, further comprising:
actively cooling the metal work piece and the electron shield while emitting the beam of electrons at the surface portion.

13. The method as recited in claim 12, wherein the second range of electron energy values maintains the surface portion within a temperature range that corresponds to a preselected metallic phase.

14. The method as recited in claim 13, wherein the electrons of the second spatial distribution are capable of dissolving the intermetallic impurities within 20 microns of the surface portion.

* * * * *